United States Patent [19]

Chan et al.

[11] Patent Number: 5,432,121
[45] Date of Patent: * Jul. 11, 1995

[54] METHOD FOR FABRICATING A MULTILAYER EPITAXIAL STRUCTURE

[75] Inventors: Joseph Chan, Kings Park; Dennis Garbis, Huntington Station; Lawrence Laterza, Miller Pace; Gregory Zakaluk, North Seaford, all of N.Y.

[73] Assignee: GI Corporation, Hatboro, Pa.

[*] Notice: The portion of the term of this patent subsequent to Jun. 28, 2011 has been disclaimed.

[21] Appl. No.: 242,877

[22] Filed: May 16, 1994

Related U.S. Application Data

[63] Continuation-in-part of Ser. No. 15,384, Feb. 9, 1993, Pat. No. 5,324,685.

[51] Int. Cl.$^6$ ............................................. H01L 21/20
[52] U.S. Cl. ..................................... 437/95; 437/110; 148/DIG. 41; 117/89
[58] Field of Search ............... 437/95, 110, 949, 973; 148/33.5, DIG. 7, DIG. 22, DIG. 41, DIG. 154; 117/88, 89

[56] References Cited

U.S. PATENT DOCUMENTS

| | | | |
|---|---|---|---|
| 3,454,434 | 7/1969 | Jackson | 148/33.5 |
| 4,696,701 | 9/1987 | Sullivan | 437/95 |
| 4,859,626 | 8/1989 | Wise | 437/110 |
| 5,073,511 | 12/1991 | Musumeci | 437/95 |
| 5,279,987 | 1/1994 | Lechaton | 437/95 |
| 5,324,685 | 6/1994 | Hirtz et al. | 437/95 |

FOREIGN PATENT DOCUMENTS 54-34756 3/1979 Japan.

OTHER PUBLICATIONS

Bauer et al., Fundamental Issues in Heteropitaxy. A Department of Energy Council on Materials Sources. Journal of Materials Research, vol. 5, #4, Apr. 1990, pp. 852–895.
Wijaranakula et al., Journal of Materials Research, vol. 1, #5, Sep./Oct. 1986, Oxygen Precipitation in Epitaxial Silicon Wafers, pp. 693–697.
Galewski et al., IEEE Transaction of Semiconductor Manufacturing, Aug. 1990, vol. 3, #3, pp. 93–97. Silicon Wafer Preparation for Low Temperature Selective Epitaxial Growth.

*Primary Examiner*—Chandra Chaudhari
*Attorney, Agent, or Firm*—James & Franklin; Harold James; Robert L. Epstein

[57] ABSTRACT

An all epitaxial process performed entirely in a CVD reactor is employed to grow epitaxial layers with accurately controlled successively low and high dopant concentrations over a heavily doped substrate, eliminating the need for a separate diffusion, even for high purity concentrations. After purging the reactor system, the heavily doped silicon substrate is "capped" by growing two successive very thin silicon sublayers of the same conductivity type. The reactor chamber is subjected to a hydrogen purge to deplete any contaminents after each sublayer is formed. The cap sublayers form a narrow, abrupt intrinsic transition region with the substrate and become an active part of the device structure. A lightly doped epitaxial layer is grown over the "capped" substrate so that a depletion region can be formed in the device under suitable reverse bias. A heavily doped epitaxial layer is then grown over the lightly doped epitaxial layer. The heavily doped epitaxial layer forms a contact layer and has a polarity opposite to that of the substrate.

18 Claims, 1 Drawing Sheet ns and more particularly to a unique multilayer epitaxial structure for use as a base material for semiconductor devices and to a method for fabricating same by epitaxial techniques which can be performed in a single continuous operation, in the chamber of a chemical vapor deposition reactor.

METHOD FOR FABRICATING A MULTILAYER EPITAXIAL STRUCTURE

This application is a continuation-in-part of application Ser. No. 08/015,384, now U.S. Pat. No. 5,324,685, filed Feb. 9, 1993.

BACKGROUND OF THE INVENTION

Field of the Invention

The present invention relates to semiconductor wafers and more particularly to a unique multilayer epitaxial structure for use as a base material for semiconductor devices and to a method for fabricating same by epitaxial techniques which can be performed in a single continuous operation, in the chamber of a chemical vapor deposition reactor.

Semiconductors of many types are formed on wafers which are commonly made of silicon crystal material. The material is produced by an epitaxial growth process in accordance with well known chemical vapor deposition principles. The growth of the material takes place in vessels called chemical vapor deposition (CVD) reactors which have facility to control growth conditions such as temperature and pressure, as well as impurity concentrations.

Certain types of semiconductors such as power rectifiers, Zener diodes and multilayer devices such as transistors have specific electrical parameter requirements, for example, forward voltage drop, leakage current and breakdown voltages, which are difficult to accurately control by conventional diffusion means. The present invention is an all epitaxial process for creating base material for use in the fabrication semiconductor devices which provides accurate controls to permit formation of a structure which is capable of meeting such device electrical parameters requirements. In addition, the invention eliminates the need for an impurity diffusion.

The multilayer structure is epitaxially grown with a top layer having high impurity concentration and a middle layer having light impurity concentration. Those layers are deposited on a substrate of high impurity concentration.

The formation of heavily doped layers by epitaxial growth usually means slow growth rates. The presence of high impurity concentrations in the material leads to problems with "outdiffusion", where the high dopant concentration layers tend to contaminate low concentration layers, as the material containing the heavily doped layer is heated to high temperature for processing. Another problem associated with heavily doped epitaxially grown layers is "autodoping" in which dopant moves into the gas stream. This autodopant together with highly concentrated dopant gas used contaminates the reactor chamber and quartzware and therefore tends to degrade resistivity control on subsequent runs (the so called "memory effect"). Consequently, where high impurity concentrations are required, it has been heretofore necessary to form the doped layers by diffusion in a separate vessel called a diffusion tube.

SUMMARY OF THE INVENTION

The present invention is a multilayer epitaxial structure with heavily doped layers and a lightly doped layer and a method for fabricating same without diffusion which overcomes the problems normally associated with use of materials with high impurity concentrations in a CVD reactor. Our process permits epitaxial technology to replace diffusion entirely. Accordingly, it permits the structure to be formed by a single continuous epitaxial process in a single apparatus. Moreover, the method produces a superior quality product, improved device performance and higher device yields.

In general, the structure starts with a heavily doped substrate of a silicon material, preferably with a resistivity of equal to or less than 0.005 ohm-cm. However, if P type material is used, the resistivity may be equal to or less than 0.002 ohm-cm. After a hydrogen purge of the reactor chamber, successive "cap" sublayers are formed on the substrate. After each "cap" sublayer is formed, the chamber is subjected to a hydrogen purge. The sublayers are of the same conductivity type, which may be the same or opposite to that of the substrate. They are very thin, each only approximately 1 to 2 microns thick and have approximately the same impurity concentrations, so as to form a narrow, abrupt intrinsic region with the substrate which becomes an active part of the active device structure.

A first epitaxial layer, which is relatively lightly doped with the same impurity concentration and conductivity type as the cap sublayers and has a relatively high resistivity (0.06 to 100 ohm-cm), is grown over the "capped" substrate, preferably to a thickness of up to 150 microns. That layer is where the depletion region will be formed when the appropriate reverse bias is applied to the device. A relatively heavily doped second epitaxial layer is then grown over the first epitaxial layer. The second epitaxial layer preferably has a thickness of approximately 40 microns and a relatively low resistivity, preferably of less than 0.005 ohm-cm. It has a polarity opposite to that of the substrate. The second epitaxial layer will form the contact region of the device. The structure formed in this way can then be subjected to further processing using well known techniques resulting in the formation of a variety of different semiconductor devices.

It is, therefore, a prime object of the present invention to provide a multilayer epitaxial structure and method for fabricating same which overcomes the problems associated with dopant memory effect and autodopant effect in a chemical vapor deposition reactor, permitting formation of a multilayer structure by an all epitaxial process.

It is further another object of the present invention to provide a multilayer epitaxial structure and method for fabricating same which includes a substrate capped with dopant depleted sublayers to minimize outdiffusion to the subsequently grown epitaxial layers.

It is another object of the present invention to provide a method for growing an all epitaxial multilayer structure which can take place in a single continuous operation in a single vessel.

It is another object of the present invention to provide a chemical vapor deposition process in which heavily doped regions can be accommodated without contamination of the vessel.

In accordance with one aspect of the present invention, a multilayer epitaxial structure is provided comprising heavily doped substrate of a given conductivity type. First and second dopant depleted sublayers are formed over the substrate. Each of the sublayers is approximately one to two microns thick. A relatively lightly doped epitaxial layer is grown above the sublayers. It has the same conductivity type as the sublayers. A relatively heavily doped epitaxial layer of conductivity type opposite to that of the substrate is grown above the lightly doped epitaxial layer.

The sublayers preferably have approximately the same dopant concentrations and the same conductivity type. The sublayers may have a conductivity type which is the same or opposite to that of the substrate.

The substrate preferably has a resistivity of equal to or less than 0.005 ohms-cm. However, if P-type material is used, the resistivity may be equal to or less than 0.002 ohm-cm. The lightly doped epitaxial layer preferably has a resistivity in the range of 0.06 to 100 ohm-cm and a thickness of up to 150 microns.

The heavily doped epitaxial layer preferably has a thickness of approximately 40 microns. It preferably has a resistivity of less than 0.005 ohm-cm.

In accordance with another aspect of the present invention, a multilayer epitaxial structure for use as a base material for a semiconductor device is formed on a relatively heavily doped substrate. First and second successive sublayers, each having approximately the same dopant concentration and the same conductivity type, are situated over the substrate. The sublayers form an intrinsic region with the substrate becoming an active part of the device. A first epitaxial layer is situated above the sublayers. The depletion region of the device will be formed in the first epitaxial layer when suitable bias voltage is applied. The first epitaxial layer has the same conductivity type as the sublayers. A second epitaxial layer is grown above the first epitaxial layer. The substrate and the second epitaxial layer are of opposite polarity. The second epitaxial layer forms a contact region.

The first sublayer preferably has a thickness of about one to two microns. The second sublayer also has a thickness of one to two microns. The resistivity of the sublayers is approximately equal to the resistivity of the first epitaxial layer.

In accordance with another aspect of the present invention, an all epitaxial method for fabricating a multilayer structure in a continous process in a CVD reactor is provided. A substrate of a given polarity, composed of heavily doped material, is employed. After a hydrogen purge of the reactor, a first silicon sublayer is grown over the substrate. The reactor is purged to deplete any contaminents in the CVD reactor gas. A second silicon sublayer is grown. After another purge of the reactor, a first epitaxial layer of lightly doped material is grown above the second silicon sublayer. A second epitaxial layer of heavily doped material is grown above the first epitaxial layer. The second epitaxial layer has a polarity opposite to that of the substrate.

The first and second sublayers are formed with the same conductivity type, which may be the same or opposite to that of the substrate. Each is formed to have a thickness of approximately one to two microns.

The sublayers have approximately the same resistivities. The resistivity of the sublayers is approximately equal to that of the first epitaxial layer.

The substrate preferably comprises a material with a resistivity equal to or less than 0.005 ohm-cm. However, if P-type material is used, the resistivity may be less than or equal to 0.002 ohm-cm.

Preferably, the silicon is introduced into the chamber to form the sublayers through the use of gases selected from a group of compounds consisting of trichlorosilane, chlorosilane or silane.

The step of growing the first epitaxial layer preferably comprises the step of epitaxially growing the first epitaxial layer in the chemical vapor deposition reactor in a hydrogen ambient at a temperature between 1000° C. and 1200° C. The layer is formed with a resistivity of up to 100 ohm-cm and a thickness of up to 150 microns.

The step of growing the second epitaxial layer comprises the step of epitaxially growing the second epitaxial layer in the chemical vapor deposition reactor in a gas environment which is the source of a dopant selected from the group of arsenic, phosphorus and antimony. The step of growing the second epitaxial layer comprises the step of epitaxially growing the layer with a resistivity of less than 0.005 ohm-cm and a thickness of less than 40 microns.

To these and such other objects which may herein after appear, the present invention relates to a multilayer epitaxial structure and method for fabricating same as described in the following specifications and recited in the annexed claims, taken together with the accompanying drawings, wherein like numerals refer to like parts and in which:

DESCRIPTION OF THE PREFERRED EMBODIMENT

Figure 1:
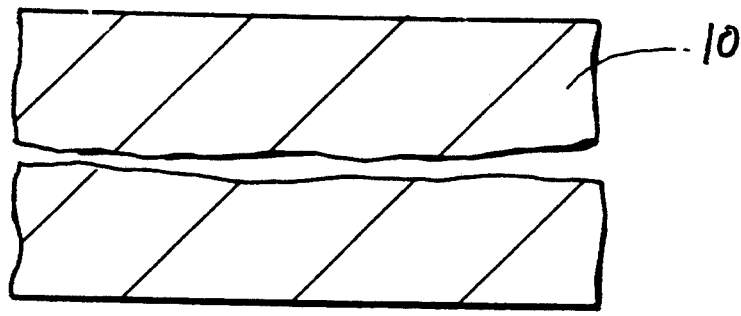
FIG. 1 is an idealized cross-sectional view of the substrate.
Figure 2:
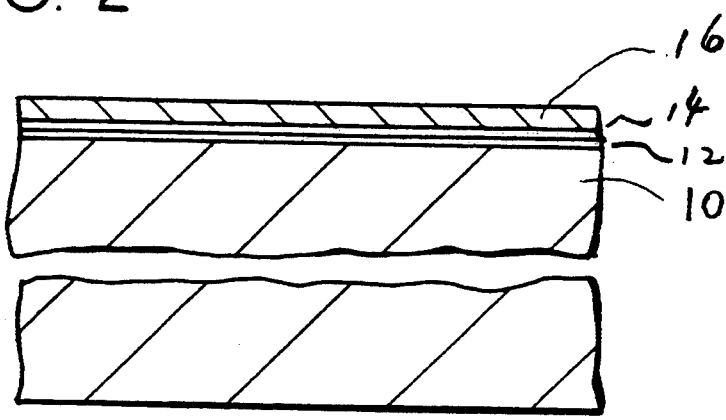
FIG. 2 is a view similar to FIG. 1, showing the first epitaxial layer formed on the "capped" substrate.
Figure 3:
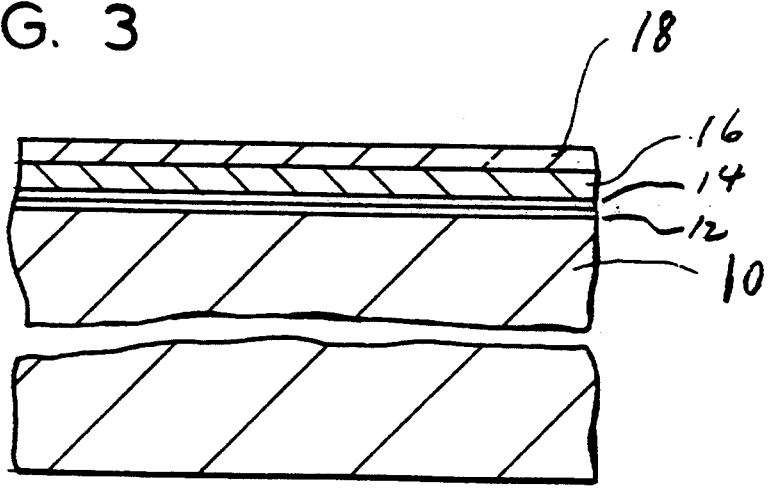
FIG. 3 is a view similar to FIG. 2, showing the second epitaxial layer formed over the first epitaxial layer.

Certain modifications to the gas feed and venting system for the CVD reactor, as described in detail in commonly owned copending application Ser. No. 08/015,658 filed Feb. 9, 1993 in the names of Joseph Chan, Dennis Garbis, John Sapio and John Latza, and entitled GAS FLOW SYSTEM FOR CVD REACTOR, make the process more suitable for use in large scale production. That application discloses a gas flow system which reduces residue dopants which would otherwise remain in the reactor or associated plumbing and may adversely affect subsequent runs by degrading resistivity control. The reader is referred to that application for further information in that regard.

The invention is described herein in the context of the processing of material for the fabrication of diodes and multilayer devices such as transistors. It is particularly useful in these applications because the process eliminates the necessity for front and back diffusions normally required when fabricating such devices. However, the invention should not be considered as being limited to this specific application. Other uses of the invention in the fabrication devices of many other configurations will be obvious to those skilled in the art.

Moreover, it should be appreciated that the drawings depict an idealized structure for purposes of illustration. The thickness of the layers is not shown to scale.

The process begins with a clean susceptor which is placed in a cleaned CVD reactor chamber and upon which wafers consisting of a heavily doped substrate 10 are positioned. Either N-type or P-type substrates can be used. A resistivity of equal to or less than 0.005 ohm-cm is preferred. If P-type, the resistivity may be equal to or less than 0.002 ohm-cm. The substrate may have a thickness of 14 to 16 mils.

Conventionally, such a wafer, after an epitaxial layer is grown on the substrate in a CVD reactor, would be transferred to a separate vessel, known as a diffusion tube, for formation of doped regions using well known diffusion techniques. However, with the present invention, the multilayer structure, including heavily doped layers, can be formed in the CVD chamber itself, in a single continuous epitaxial process.

The susceptor in the CVD chamber is preferably silicon coated. This minimizes autodoping from the backside of the substrate. Starting with a clean susceptor and a cleaned CVD reactor is important to prevent contamination. Silicon capping techniques are used to minimize outdiffusion from the substrate.

After heating the substrate in the CVD chamber and cleaning and etching the surface with HCl, the substrate surface is "capped". Capping is accomplished by first purging the reactor system for about 10 minutes with hydrogen and then growing a "cap" consisting of two very thin silicon sublayers 12, 14 over the substrate. Any contaminents remaining in the reactor chamber or in the gas in the chamber are depleted by purging the system after the formation of each sublayer. Both sublayers 12, 14 are of the same conductivity type which may be the same or opposite to that of the substrate. Usually they have approximately equal dopant concentrations. However, in some cases, the dopant concentration of the first sublayer 12 may be higher than the dopant concentration of the second sublayer 14 to compensate for the outdiffusion of the dopant from the substrate into the first sublayer 12.

The substrate is heated to a temperature over 1000° C. in an $H_2$ atmosphere containing a silicon source gas to form each sublayer to thickness of about 1 to 2 microns. The growth rate is relatively fast, approximately 2.5 microns per minute, to minimize cycle time. Each sublayer takes about 20 to 60 seconds to form. After each sublayer is formed, a hydrogen purge of the reactor is preformed for about 1 minute. At present, two cap sublayers are preferred, although more may be employed, if desirable. The sublayers form a narrow, abrupt intrinsic transition region with the substrate and therefore will become an active part of the device structure.

The silicon source for the cap sublayers is preferably trichlorosilane. It is introduced in the reactor in a hydrogen ambient of one atmospheric pressure and at a temperature between 1000° C. and 1200° C. However, other sources of silicon, such as chlorosilane or silane, can be used with appropriate temperature and growth rates.

A first layer 16 is then epitaxially grown over the capped substrate surface in the CVD reactor. Layer 16 is the location where the depletion region of the device will form when the device is suitably reversed biased. This is a relatively lightly doped, high ohmic region and has a conductivity type the same as sublayers 12, 14. It has a dopant concentration approximately equal to that of the sublayers. An appropriate source gas provides the necessary impurities. This layer has a resistivity in the range of up to 100 ohm-cm. It has a thickness of up to 150 microns.

After a 4 minute hydrogen purge, a second layer 18 is epitaxially grown on the first epitaxial layer 16. Layer 18 will be of a low ohmic region, and is relatively heavily doped, like the substrate. It is, however, of opposite polarity to the substrate. Layer 18 will form a contact layer. Phosphine may be used as a source of phosphorus ions. Alternatively, arsenic or antimony ions can be employed. The resistivity of this layer is similar to that of the substrate. A thickness for layer 18 of approximately 40 microns is preferred.

The material obtained by this process may be used as a base material for various types of semiconductor devices. Well known processes may be employed to form a variety of different diodes, rectifiers or transistors with improved characteristics.

Throughout the process, the growth temperatures are 1000° C. and 1200° C. and pressure in the reactor is kept at 1 atmosphere in a hydrogen ambient. Silicon-coated susceptors are employed in the CVD reactor to minimize autodoping from the backside of the substrate. The susceptors and CVD reactor chambers are preferably cleaned between each run. Hydrogen purges are employed to deplete the contaminents in the chamber and reactor gas after each sublayer is grown. Fast growth rates of approximately 2.5 microns per minute minimize cycle time.

This process permits the entire structure to be achieved in a single continuous production run in a single apparatus. Moreover, the process eliminates the need for front and back diffusions normally required for power semiconductor devices.

This invention serves to improve the forward voltage drop and breakdown voltage distribution characteristics of the semiconductor devices. The heavily doped layers improve ohmic contact during metallization and packaging. It also reduces processing steps by simplifying the process to be all epitaxial and at the same time improves fabrication yields.

It should now be appreciated that the present invention relates to a multilayer epitaxial structure and an all epitaxial method for fabricating same. The structure includes a heavily doped, low resistivity substrate of one polarity, a high resistivity, middle layer grown on the capped substrate and a heavily doped, low resistivity top layer of opposite polarity to the substrate, grown on the middle layer. The cap on the substrate is formed of at least two sublayers which are extremely thin.

While only a single embodiment of the present invention has been disclosed for purposes of illustration, it is obvious that many variations and modifications could be made thereto. It is intended to cover all of these variations and modifications which fall within the scope of the present invention as defined by the following claims:

We claim:

1. An all epitaxial method of fabricating a multilayer structure in a continuous process in a CVD reactor chamber comprising the steps of:
   (a) positioning a heavily doped silicon substrate of a first conductivity type on a susceptor in the reactor chamber;
   (b) heating the chamber;
   (c) purging the reactor chamber to deplete contaminents therein;
   (d) growing a doped first silicon sublayer over the substrate;
   (e) purging the reactor chamber to deplete contaminents therein;
   (f) growing a doped second silicon sublayer over said first sublayer;
   (g) purging the reactor to deplete any contaminents therein;
   (h) growing a lightly doped first epitaxial layer above the second silicon sublayer; and (i) growing a heavily doped second epitaxial layer above the first epitaxial layer, the second epitaxial layer having a conductivity type opposite to that of the substrate.

2. The method of claim 1 wherein the step of growing a first silicon sublayer comprises the step of growing the first silicon sublayer with a conductivity type opposite to that of the substrate.

3. The method of claim 1 wherein the step of growing a second silicon sublayer comprises the step of growing the second silicon sublayer with a conductivity type the same as the conductivity type of the first silicon sublayer.

4. The method of claim 1 wherein the step of growing a first silicon sublayer comprises the step of growing the first silicon sublayer with a conductivity type which is the same as the substrate.

5. The method of claim 4 wherein the step of growing a second silicon sublayer comprises the step of growing the second silicon sublayer with a conductivity type the same as the conductivity type of the first silicon sublayer.

6. The method of claim 1 wherein the step of growing the first silicon sublayer comprises the step of growing the first silicon sublayer to a thickness of approximately one to two microns.

7. The method of claim 1 wherein the step of growing the second silicon sublayer comprises the step of growing the second silicon sublayer to a thickness of approximately one to two microns.

8. The method of claim 1 wherein the step of growing the second silicon sublayer comprises the step of growing the second silicon sublayer to have a resistivity which is approximately the same as the resistivity of the first silicon sublayer.

9. The method of claim 1 wherein the step of growing the second silicon sublayer comprises the step of growing the second silicon sublayer to have a resistivity approximately equal to the resistivity of the first epitaxial layer.

10. The method of claim 1 wherein the step of positioning the substrate comprises employing a substrate which has a resistivity of equal to or less than 0.005 ohm-cm.

11. The method of claim 9 wherein the step of positioning the substrate comprises employing a substrate which has a resistivity equal to or less than 0.002 ohm-cm for P-type material.

12. The method of claim 1 wherein the step of growing the first epitaxial layer comprises the step of growing the first epitaxial layer in a hydrogen ambient at a temperature between 1000° C. and 1200° C.

13. The method of claim 1 wherein the step of growing the first epitaxial layer comprises the step of growing the first epitaxial layer with a resistivity of less than 100 ohm-cm.

14. The method of claim 1 wherein the step of growing the second epitaxial layer comprises the step of growing the second epitaxial layer with a resistivity of less than 0.005 ohm-cm.

15. The method of claim 1 wherein the step of growing the second epitaxial layer comprises the step of growing the second epitaxial layer with a thickness of approximately 40 microns.

16. The method of claim 1 wherein the step of growing the first epitaxial layer comprises the step of growing the first epitaxial layer with a thickness of up to 150 microns.

17. The method of claim 1 wherein the step of growing the first epitaxial layer comprises the step of growing the first epitaxial layer to have the same conductivity type as the first silicon sublayer.

18. The method of claim 1 wherein the multilayer structure forms a base material for a semiconductor device.

* * * * *